(12) United States Patent
Sio et al.

(10) Patent No.: US 11,270,936 B2
(45) Date of Patent: Mar. 8, 2022

(54) INTEGRATED CIRCUIT INCLUDING SUPERVIA AND METHOD OF MAKING

(71) Applicant: TAIWAN SEMICONDUCTOR MANUFACTURING COMPANY LTD., Hsinchu (TW)

(72) Inventors: Kam-Tou Sio, Zhubei (TW); Jiann-Tyng Tzeng, Hsinchu (TW); Wei-Cheng Lin, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 189 days.

(21) Appl. No.: 16/530,770

(22) Filed: Aug. 2, 2019

(65) Prior Publication Data
US 2020/0135640 A1 Apr. 30, 2020

Related U.S. Application Data

(60) Provisional application No. 62/753,516, filed on Oct. 31, 2018.

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76804* (2013.01); *H01L 21/76877* (2013.01); *H01L 23/528* (2013.01)

(58) Field of Classification Search
CPC .................................................. H01L 23/5226
See application file for complete search history.

(56) References Cited

U.S. PATENT DOCUMENTS

| | | | | |
|---|---|---|---|---|
| 5,269,880 | A * | 12/1993 | Jolly | H01L 21/02063 148/DIG. 161 |
| 7,260,442 | B2 | 8/2007 | Hwang et al. | |
| 9,256,709 | B2 | 2/2016 | Yu et al. | |
| 10,020,254 | B1 * | 7/2018 | Bao | H01L 23/5226 |
| 10,020,255 | B1 * | 7/2018 | Bao | H01L 21/76879 |
| 2003/0112576 | A1 * | 6/2003 | Brewer | H01L 24/24 361/119 |
| 2008/0179755 | A1 * | 7/2008 | Andry | H01L 23/49827 257/774 |
| 2014/0040838 | A1 | 2/2014 | Liu et al. | |

(Continued)

*Primary Examiner* — Douglas M Menz
(74) *Attorney, Agent, or Firm* — Hauptman Ham, LLP

(57) ABSTRACT

An integrated circuit includes a substrate and a first conductive line extending in a first direction parallel to a top surface of the substrate, wherein the first conductive line is a first distance from the top surface of the substrate. The integrated circuit further includes a second conductive line extending in a second direction parallel to the top surface of the substrate, wherein the second conductive line is a second distance from the top surface of the substrate, and the second distance is greater than the first distance. The integrated circuit further includes a third conductive line extending in the first direction, wherein the second conductive line is a third distance from the top surface of the substrate, and the third distance is greater than the second distance. The integrated circuit further includes a supervia directly connected to the first conductive line and the third conductive line.

20 Claims, 14 Drawing Sheets

(56) References Cited

U.S. PATENT DOCUMENTS

| | | | |
|---|---|---|---|
| 2014/0264922 A1* | 9/2014 | Chen | H01L 23/5226 257/774 |
| 2015/0278429 A1 | 10/2015 | Chang | |
| 2015/0357282 A1* | 12/2015 | Lau | H01L 23/5226 257/401 |
| 2017/0033102 A1* | 2/2017 | Kim | H01L 27/0207 |
| 2017/0125353 A1* | 5/2017 | Chen | H01L 21/76816 |
| 2017/0221818 A1* | 8/2017 | Lau | H01L 27/088 |
| 2019/0148287 A1* | 5/2019 | Chang | H01L 23/53295 257/368 |
| 2019/0157139 A1* | 5/2019 | Cheng | H01L 21/76834 |

\* cited by examiner

INTEGRATED CIRCUIT INCLUDING SUPERVIA AND METHOD OF MAKING

PRIORITY CLAIM

The present application claims the priority of U.S. Provisional Application No. 62/753,516, filed Oct. 31, 2018, which is incorporated herein by reference in its entirety.

RELATED APPLICATION

This application is related to U.S. patent application Ser. No. 16/530,808, filed Aug. 2, 2019, entitled SEMICONDUCTOR DEVICE INCLUDING DEEP VIAS, AND METHOD OF GENERATING LAYOUT DIAGRAM FOR SAME, now U.S. Pat. No. 11,127,673, issued Sep. 21, 2021, which is incorporated herein by reference in its entirety.

BACKGROUND

Interconnect structures are used to convey signals and power between different elements within an integrated circuit (IC). Elements of the IC include passive elements, such as capacitor or resistors, as well as active elements, such as transistors. Conductive lines are used to convey signals in one or more directions parallel to a top surface of a substrate. Conductive lines are arranged in layers above the substrate. Conductive vias are used to electrically connect conductive lines on different layers. During operation of the IC, signals or power are conveyed along paths defined by the conductive lines and the conductive vias in order for the IC to perform a designed function.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
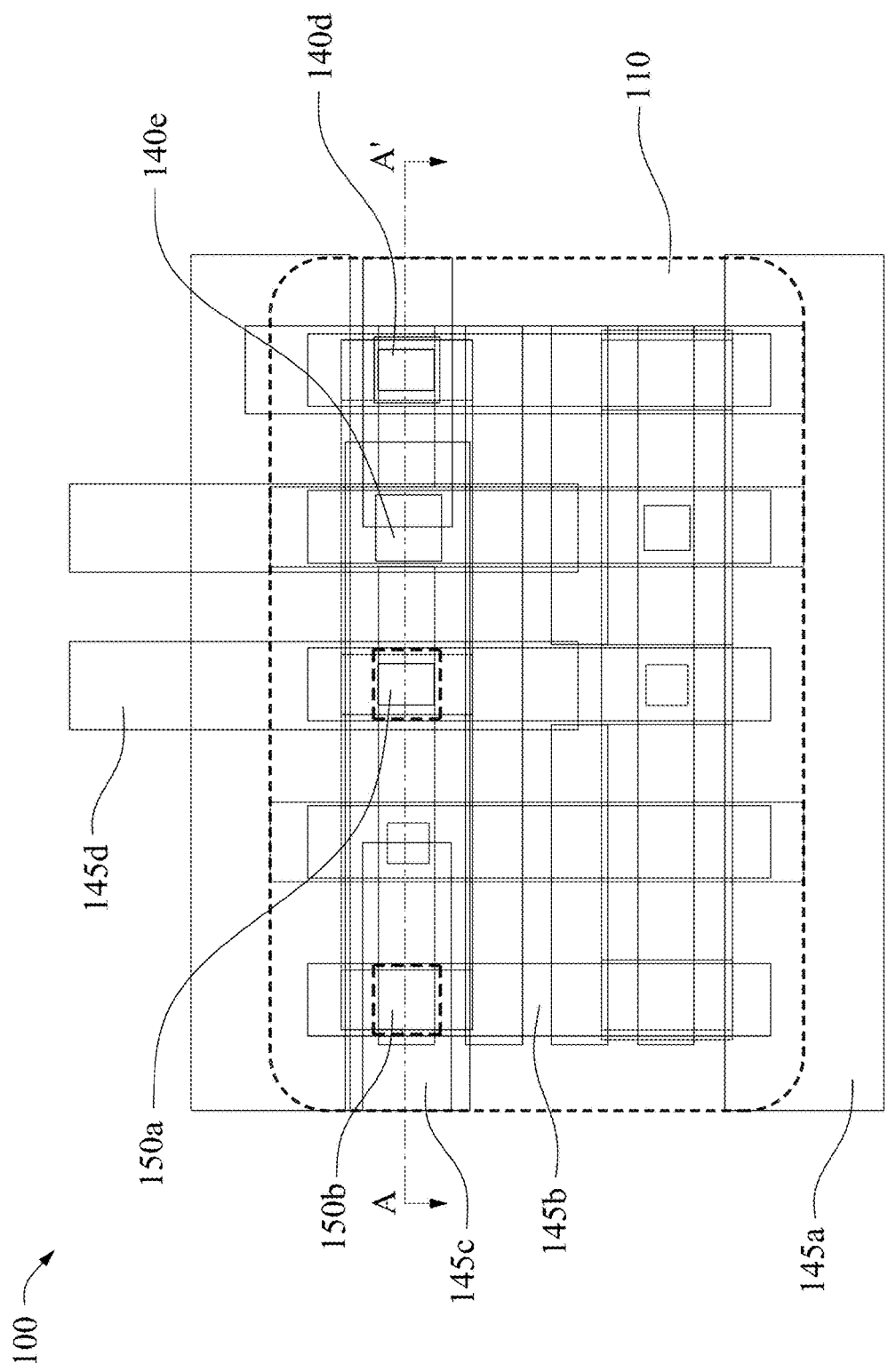
FIG. 1 is a top view of an integrated circuit (IC) region according to some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As a size of semiconductor devices continues to shrink, routing of conductive lines and conductive vias for interconnect structures becomes more complicated. Conductive lines and conductive vias are arranged in layers, known as metal layers, over a substrate of the integrated circuit (IC). While the layers are known as metal layers, the conductive lines and conductive vias are not necessarily formed of a metallic material.

In some semiconductor devices, once the size of the semiconductor device is reduced to a certain point, the interconnect structure is limited to one-dimensional (1D) routing in order to permit reliable manufacturing of the IC. 1D routing means that the conductive lines extend only in a single direction. For example, conductive lines in a first metal layer will extend in an X-direction; and conductive lines in a second metal layer above the first metal layer will extend in a Y-direction perpendicular to the X-direction.

Conductive lines are arranged along routing tracks. Routing tracks are locations in the interconnect structure that are available for conductive lines. In some instances, at least a portion of routing tracks do not include conductive lines. In some semiconductor devices a pitch between adjacent routing tracks changes as a distance from the substrate increases. In 1D routing schemes, these differences in pitch result in fewer available locations for conductive vias to provide electrical connection between conductive lines on different metal layers of the interconnect structure.

Another concern for interconnect structures as the size of semiconductor devices decreases is electro-migration (EM). EM is the result of current passing through a conductive element causing atoms within the conductive element to move over time in the direction of current flow. Over time, EM has a risk of creating an open circuit; or increasing resistance within a conductive line to a point where the IC no longer functions as designed. EM is an even greater concern when a current is forced to change direction. For example, when a signal travels along a conductive via in a direction toward the substrate and then turns to travel along a conductive line parallel to the substrate, the effects of EM at the intersection of the conductive lines and the conductive via are increased.

The use of supervias helps to improve routing for ICs because supervias reduce EM effects in the interconnect structure and are able to by-pass metal layers in the interconnect structure in order to reduce complexity in the interconnect structure. A supervia is a conductive via that connects a conductive line in a first metal layer to a conductive line in a third metal layer that is separated from the first metal layer by an intermediate second metal layer. The use of supervias reduces the number of turns a signal takes while moving through the interconnect structure, which reduces EM effects. Supervias also reduce the number of conductive lines that are formed in each metal layer because the intermediate conductive line between the first metal layer and third metal layer is omitted. As a result, complexity of the interconnect structure is decreased. Decreasing the complexity of the interconnect structure helps to increase production yield and reduce manufacturing cost.

Figure 2:
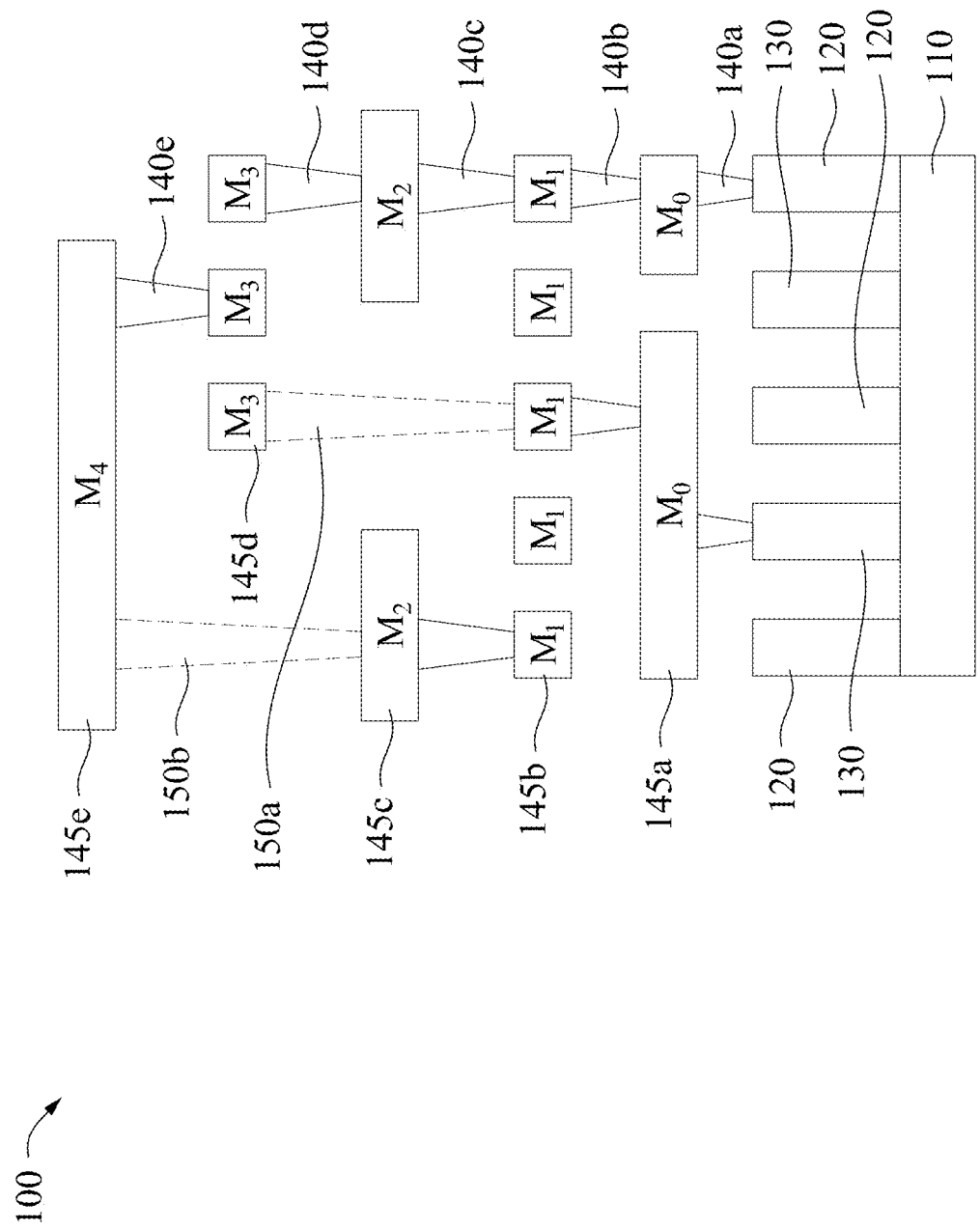
FIG. 2 is a cross-sectional view of the IC region of FIG. 1 according to some embodiments.
Figure 3:
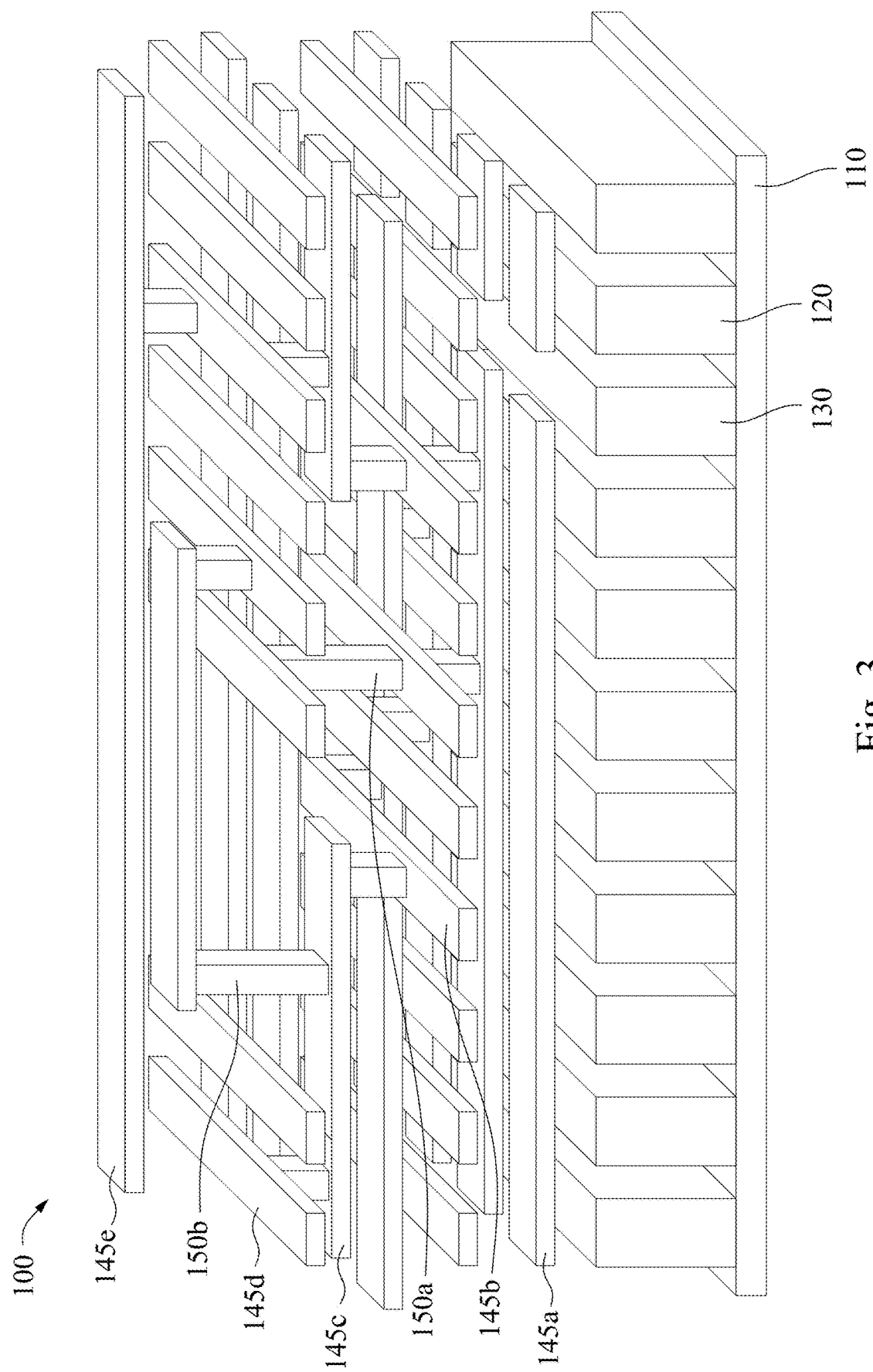
FIG. 3 is a perspective view of the IC region of FIG. 1 according to some embodiments.

FIG. 1 is a top view of an IC region 100 according to some embodiments. FIG. 2 is a cross-sectional view of IC region 100 taken along lines A-A' according to some embodiments. FIG. 3 is a perspective view of IC region 100 according to some embodiments. The following description of IC region 100 is made with reference to FIGS. 1, 2 and 3. For the sake of clarity in the drawings, not every element is labeled in each of the FIGS. 1, 2 and 3.

IC region 100 includes a substrate 110 including active elements. In some embodiments, IC region also includes passive elements. IC region 100 includes Fin field effect transistors (FinFETs), which include both a source/drain (S/D) contact structure 120 and a gate structure 130. In some embodiments, IC region 100 includes a different type of transistor.

An interconnect structure is electrically connected to contact structure 120 and gate structure 130. The interconnect structure includes metal layer zero (M0) vias 140a. One M0 via 140a is electrically connected to a contact structure 120; and one M0 via 140a is electrically connected to a gate structure 130. M0 conductive lines 145a are electrically connected to M0 vias 140a. M0 conductive lines 145a extend in a first direction parallel to a top surface of substrate 110. As noted above, the term metal layer is not intended to limit vias and conductive lines in the interconnect structure to metal structures.

Metal layer one (M1) vias 140b are electrically connected to M0 conductive lines 145a. M1 conductive lines 145b are electrically connected to M1 vias 140b. M1 conductive lines 145b extend in a second direction parallel to the top surface of substrate 110. M1 conductive lines 145b extend perpendicular to M0 conductive lines 145a. In some embodiments, M1 conductive lines 145b are at an angle other than 90-degrees with respect to M0 conductive lines 145a.

Metal layer two (M2) vias 140c are electrically connected to M1 conductive lines 145b. M2 conductive lines 145c are electrically connected to M2 vias 140c. M2 conductive lines 145c extend in the first direction parallel to M0 conductive lines 145a. In some embodiments, M2 conductive lines 145c are at an angle with respect to M0 conductive lines 145a.

Metal layer three (M3) vias 140d are electrically connected to M2 conductive lines 145c. M3 conductive lines 145d are electrically connected to M3 vias 140d. M3 conductive lines 145d extend in the second direction parallel to M1 conductive lines 145b. In some embodiments, M3 conductive lines 145d are at an angle with respect to M1 conductive lines 145b.

Metal layer four (M4) via 140e are electrically connected to M3 conductive lines 145d. M4 conductive line 145e is electrically connected to M4 via 140e. M4 conductive line 145e extends in the first direction parallel to M0 conductive lines 145a. In some embodiments, M4 conductive line 145e is at an angle with respect to M0 conductive lines 145a.

Supervia 150a electrically connects an M1 conductive line 145b to an M3 conductive line 145d. In contrast with M2 via 140c, supervia 150a electrically connects conductive lines spaced apart by multiple metal layers. That is, the M2 conductive lines 145c are bypassed by supervia 150a. By by-passing M2 conductive lines 145c, supervia 150a helps to reduce complexity of the interconnect structure. In addition, a length of M2 conductive lines 145c are able to be increased in IC region 100 in comparison with structures that do not include supervias because a length of supervia 150a in the first direction on M2 is less than a length of a corresponding M2 conductive line 145c.

Supervia 150b electrically connects an M2 conductive line 145c to M4 conductive line 145e. In contrast with M3 via 140d, supervia 150b electrically connects conductive lines spaced apart by multiple metal layers. That is, the M3 conductive lines 145d are bypassed by supervia 150b. By by-passing M3 conductive lines 145d, supervia 150b helps to reduce complexity of the interconnect structure. In addition, a length of M3 conductive lines 145d are able to be increased in IC region 100 in comparison with structures that do not include supervias because a length of supervia 150b in the second direction on M3 is less than a length of a corresponding M3 conductive line 145d.

IC region 100 includes supervia 150a extending between M1 conductive line 145b and M3 conductive line 145d. In some embodiments, supervia 150a is usable to connect conductive lines in any two spaced apart metal layers. In some embodiments, a supervia is used to electrically connect contact structure 120 or gate structure 130 to an M1 conductive line 145b.

One of ordinary skill in the art would understand that the interconnect structure also includes a dielectric material surrounding the various conductive lines and vias. The dielectric material is not shown in FIGS. 1-3 for the sake of simplicity in the drawings.

Conductive elements in each metal layer are surrounded by a dielectric material. In some embodiments, a dielectric layer below the M0 level is called an inter-layer dielectric (ILD). In some embodiments, an etch stop layer, such as a contact etch stop layer (CESL), is deposited over contact structure 120 and gate structure 130 prior to depositing the ILD. The etch stop layer includes silicon oxide, silicon nitride, silicon oxynitride, silicon carbide, silicon oxycarbide, or another suitable material. In some embodiments, the formation of the etch stop layer includes a deposition process and then an etch back process. The etch stop layer is deposited by CVD, high density plasma CVD (HDP-CVD), spin-on coating, physical vapor deposition (PVD), atomic layer deposition (ALD), and/or other suitable method. Afterward, for example, the ILD is deposited by CVD, PVD, high density plasma (HDP), spin-on-dielectric (SOD) process, other suitable processes, and/or combination thereof. In some embodiments, the deposition process is followed by a planarization process, such as a chemical mechanical polishing (CMP) process, an etch process, or another suitable process.

In some embodiments, the ILD includes an insulating material such as silicon oxide, silicon nitride, undoped silicate glass (USG), Boro-Silicate Glass (BSG), a low-k dielectric material, TEOS, other suitable materials, and/or combination thereof. In some embodiments, the ILD is planarized to be coplanar with a top surface of contact structure 120 and gate structure 130. For example, the ILD is planarized by using a chemical mechanical planarization (CMP) to remove portions of the ILD over contact structure 120 and gate structure 130. In some embodiments, the CMP is applied to remove the etch stop layer above contact structure 120 and gate structure 130. In various embodiments, other planarization techniques are used, such as an etch process.

In some embodiments, a dielectric layer at the M0 level or above is called an inter-metal dielectric (IMD) layer. In some embodiments, a second etch stop layer is deposited over the ILD and an interface layer is deposited over the second etch stop layer. In some embodiments, the second etch stop layer is deposited over the IMD layer at each metal level. The second etch stop layer includes silicon nitride, silicon oxynitride, silicon carbide, silicon oxycarbide, or other suitable materials. The formation of the second etch stop layer includes a deposition process by CVD, sputtering, or other suitable process. The IMD layer includes a low-k dielectric material, which usually has a dielectric constant lower than 3, or extreme low-k (ELK) dielectric material, which usually has a dielectric constant lower than 2.6. In some embodiments, a hard mask layer or a contact feature is formed between the dielectric structure and the second etch stop layer. The IMD layer is formed over the interface layer. In some embodiments, the IMD layer is made of a same dielectric material or a different dielectric material from the ILD. The second etch stop layer has a different etch selectivity from the IMD layer.

In some embodiments, conductive elements in the various metal levels are formed in an iterative manner until the completion of the interconnect structure. Each conductive via 140a-140e, each conductive line 145a-145e and each supervia 150a-150b includes at least one of copper, copper alloy, tungsten, aluminum, gold or another suitable material. In some embodiments, at least one conductive via 140a-140e has a different composition from at least one other conductive via, conductive line 145a-145e or supervia 150a-150b. In some embodiments, at least one conductive line 145a-145e has a different composition from at least one other conductive line, conductive via 140a-140e or supervia 150a-150b. In some embodiments, at least one supervia 150a-150b has a different composition from at least one other supervia, conductive line 145a-145e or conductive via 140a-140e.

Figure 4A:
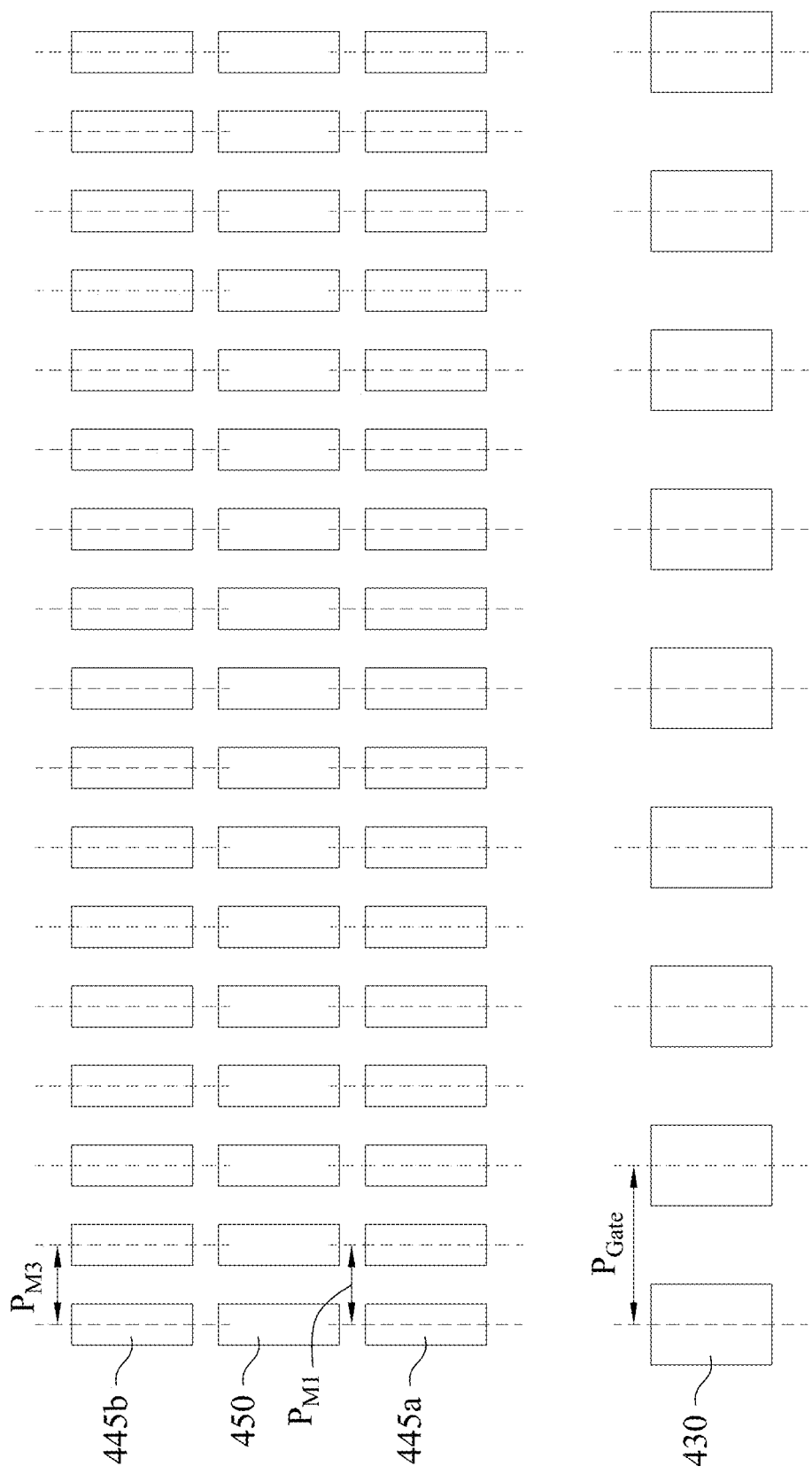
FIGS. 4A-4D are diagrams of a pitch of elements of an IC according to some embodiments.

FIG. 4A is a diagram of a pitch of elements of an IC according to some embodiments. FIG. 4A includes conductive lines 445a on a first metal level and conductive lines 445b on a third metal level. Supervias 450 are used to electrically connect corresponding conductive lines 445a on the first metal level and conductive lines 445b on the third metal level. The first metal level is separated from the third metal level by an intervening second metal level that is not shown in FIG. 4A for the sake of simplicity. FIG. 4A also includes gate structures 430.

Routing tracks for conductive lines 445a are separated by a first metal level pitch $P_{M1}$. Routing tracks for conductive lines 445b are separated by a third metal level pitch $P_{M3}$. FIG. 4A includes every routing track is occupied in the first metal level and in the third metal level. In some embodiments, at least one routing track in the first metal level or the third metal level is unoccupied by a corresponding conductive line. A magnitude of the $P_{M1}$ and $P_{M3}$ are determined in part by process capability controls. That is, for smaller node size technologies, $P_{M1}$ and $P_{M3}$ are smaller in comparison with larger node size technologies. In FIG. 4A, a ratio of $P_{M1}$ to $P_{M3}$ is 1:1. This means that every routing track in the first metal level is aligned with every routing track in the third metal level. A 1:1 ratio of $P_{M1}$ to $P_{M3}$ provides 100% access for supervias 450 to connect a conductive line 445a to a corresponding conductive line 445b. As the amount of access increases, more supervias 450 are able to be used in the interconnect structure which reduces complexity of the interconnect structure.

Gate structures 430 are separated by a gate pitch $P_{Gate}$. In FIG. 4A, a ratio between PGate and $P_{M1}$ is 1:2. This means that every other routing track in the first metal level is aligned with a gate structure 120. This provides 50% access for supervias (not shown) to electrically connect a gate structure 120 to a corresponding conductive line 445a in the first metal level.

Figure 4B:
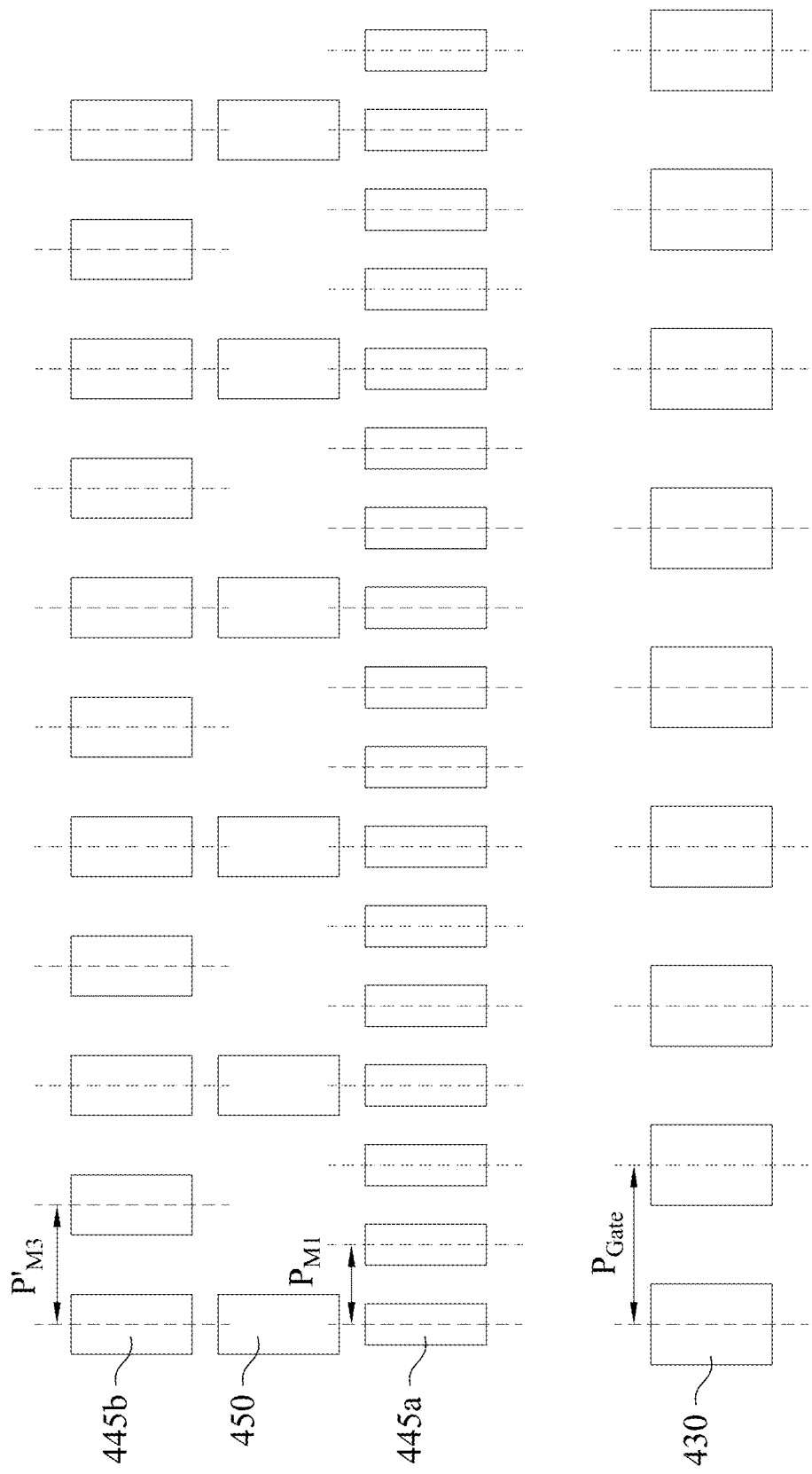

FIG. 4B is a diagram of a pitch of elements of an IC according to some embodiments. In comparison with FIG. 4A, FIG. 4B includes a third metal level pitch $P'_{M3}$. A ratio of $P_{M1}$ to $P'_{M3}$ is 2:3. This means that every third routing track in the first metal level is aligned with every second routing track in the third metal level. A 2:3 ratio of $P_{M1}$ to $P'_{M3}$ provides 50% access for supervias 450 to connect a conductive line 445a to a corresponding conductive line 445b. The pitch ratio in FIG. 4B provides fewer access points for supervias 450 in comparison with FIG. 4A.

FIG. 4B includes a width of conductive lines 445b being greater than a width of conductive lines 445a. In contract, a width of conductive lines 445b is the same as a width of conductive lines 445a in FIG. 4A. In some embodiments, a size of conductive lines increases a distance between the metal level and the substrate increases. This provides reduced resistance in the conductive lines and via in the higher metal levels. However, the larger conductive lines and via occupy more space which results is greater separation between routing tracks in the higher metal levels.

Figure 4C:
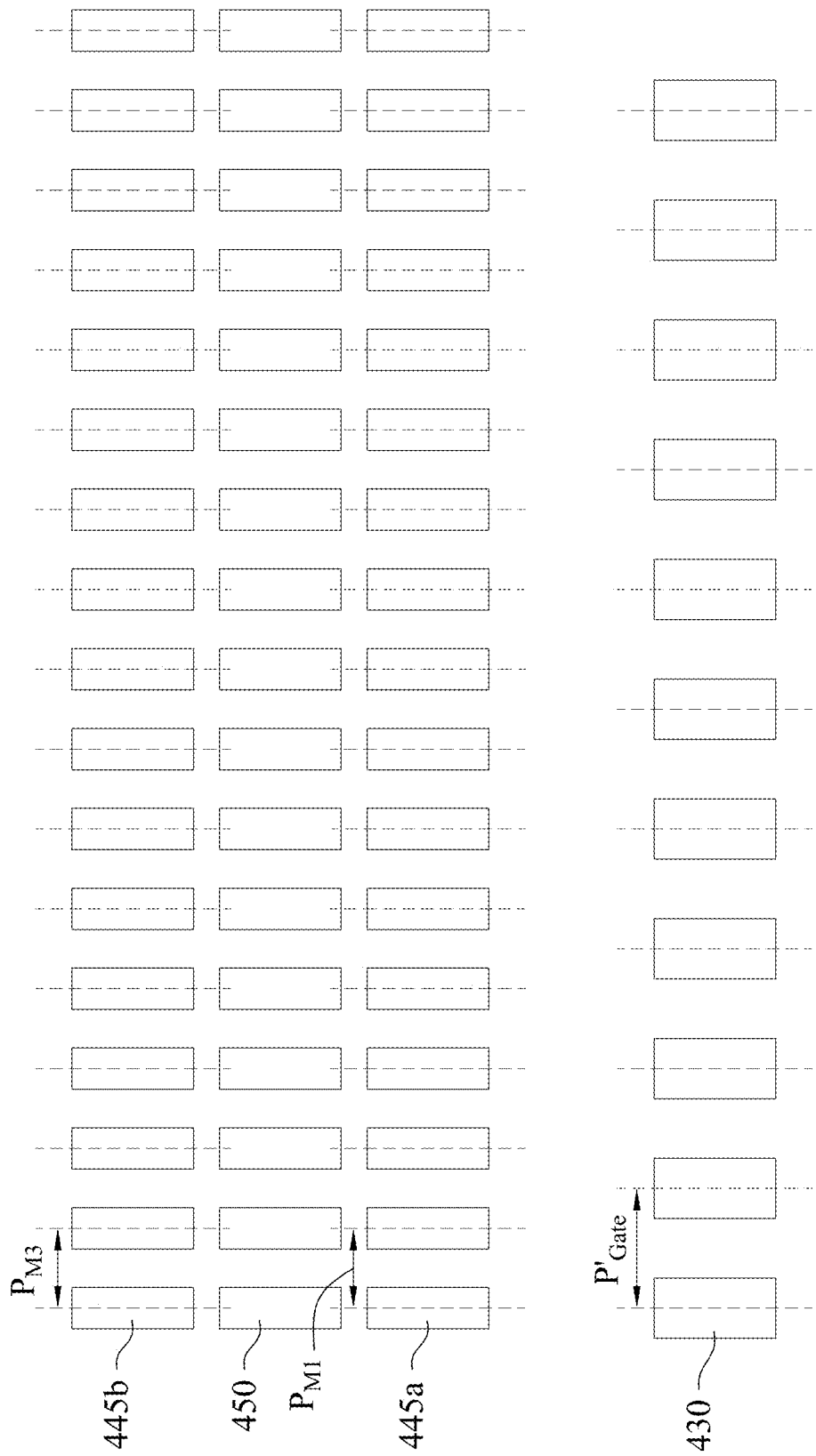

FIG. 4C is a diagram of a pitch of elements of an IC according to some embodiments. In comparison with FIG. 4A, FIG. 4C includes a gate pitch $P'_{Gate}$. A ratio of $P_{M1}$ to $P'_{Gate}$ is 2:3. This means that every third routing track in the first metal level is aligned with every second gate structure. A 2:3 ratio of $P_{M1}$ to $P'_{Gate}$ provides 33% access for supervias to connect a conductive line 445a to a corresponding gate structure 430. The pitch ratio in FIG. 4C provides fewer access points for supervias in comparison with FIG. 4A.

Figure 4D:
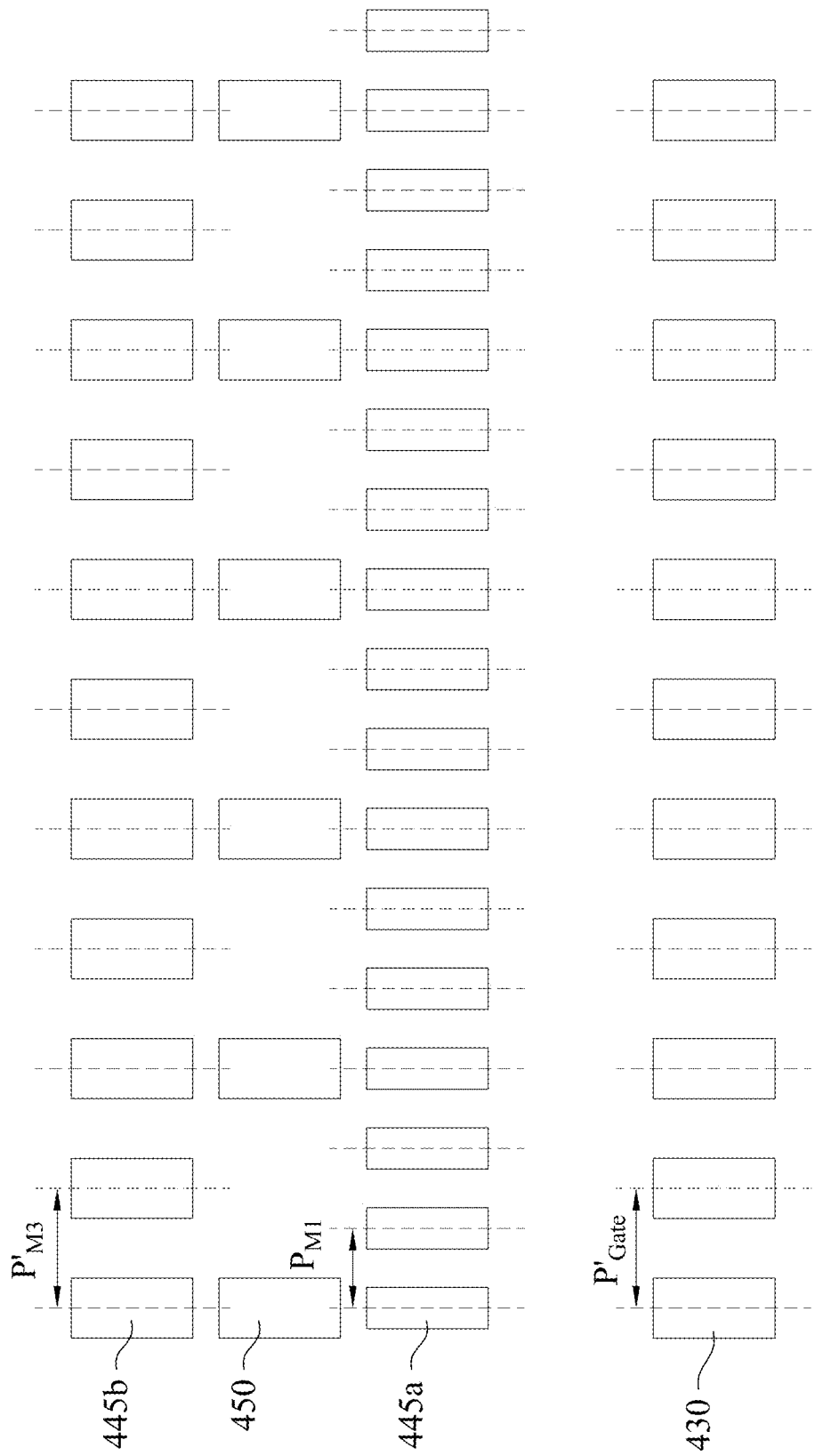

FIG. 4D is a diagram of a pitch of elements of an IC according to some embodiments. In comparison with FIG. 4A, FIG. 4D includes a third metal level pitch $P'_{M3}$. A ratio of $P_{M1}$ to $P'_{M3}$ is 2:3. This means that every third routing track in the first metal level is aligned with every second routing track in the third metal level. A 2:3 ratio of $P_{M1}$ to $P'_{M3}$ provides 50% access for supervias 450 to connect a conductive line 445a to a corresponding conductive line 445b. The pitch ratio in FIG. 4D provides fewer access points for supervias 450 in comparison with FIG. 4A. In comparison with FIG. 4A, FIG. 4D also includes a gate pitch $P'_{Gate}$. A ratio of $P_{M1}$ to $P'_{Gate}$ is 2:3. This means that every third routing track in the first metal level is aligned with every second gate structure. A 2:3 ratio of $P_{M1}$ to $P'_{Gate}$ provides 33% access for supervias to connect a conductive line 445a to a corresponding gate structure 430. The pitch ratio in FIG. 4D provides fewer access points for supervias in comparison with FIG. 4A.

Figure 5B:
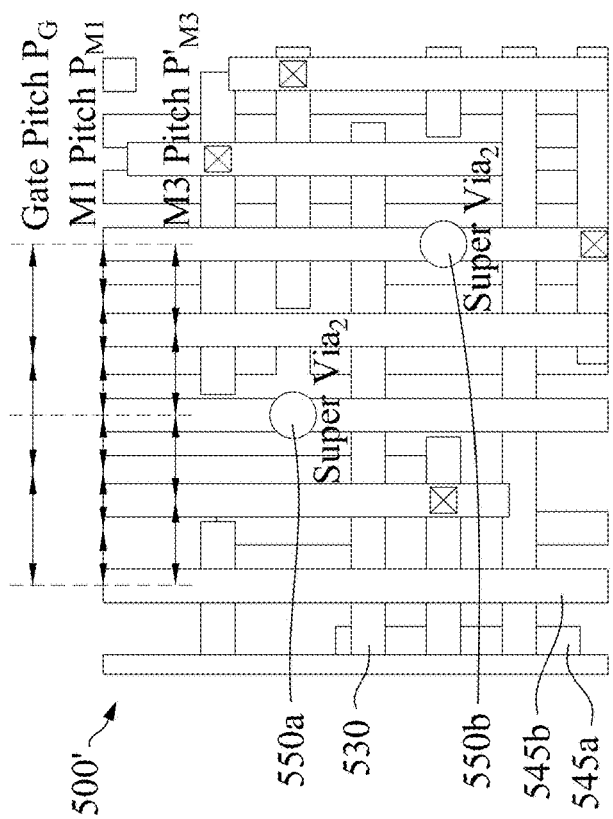
FIG. 5B is a top view of an IC region according to some embodiments.
Figure 5A:
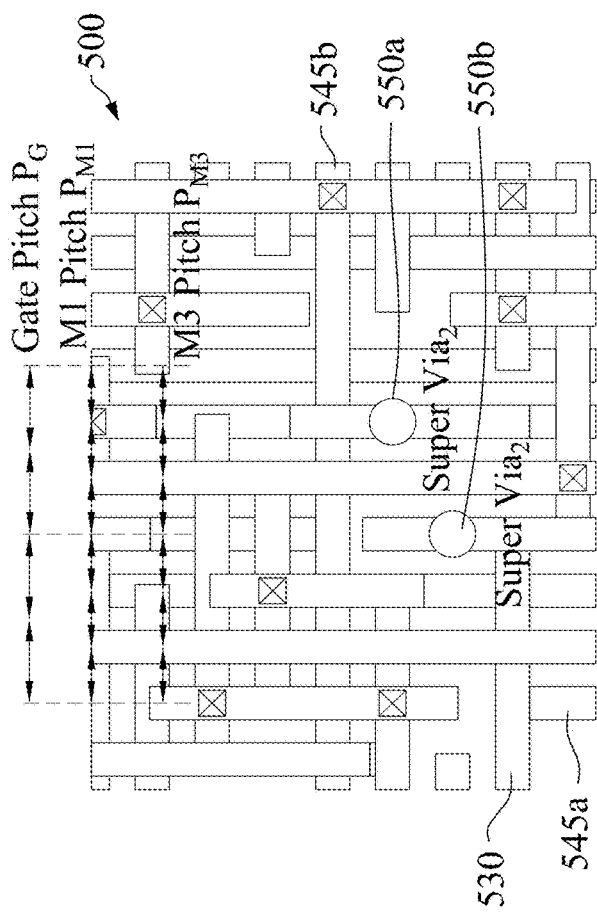
FIG. 5A is a top view of an IC region according to some embodiments.

FIG. 5A is a top view of an IC region 500 according to some embodiments. IC region 500 includes conductive lines 545a on the first metal level and conductive lines 545b on the second metal level. Gate structures 530 are also included in IC region 500. Supervias 550a-550b electrically connect a conductive line 545a on the first metal level to a conductive line 545b on the third metal level. IC region 500 includes each conductive line 545a aligned with a corresponding conductive line 545b. Similar to the arrangement in FIG. 4A, IC region 500 provides a high number of access points for supervias because a ratio of $P_{M1}$ to $P_{M3}$ is 1:1. In contrast to FIG. 4A, some conductive lines 545b do not overlap with conductive lines 545a along a same routing track. While the pitch ratio is a factor is determining the availability of access points for utilizing a supervia, the connections between different components in IC region 500 remove some of the access points because of a lack of overlapping portions of conductive lines in the different metal levels.

FIG. 5B is a top view of an IC region 500' according to some embodiments. IC region 500' includes conductive lines 545a on the first metal level and conductive lines 545b on the second metal level. Gate structures 530 are also included in IC region 500. Supervias 550a-550b electrically connect a conductive line 545a on the first metal level to a conductive line 545b on the third metal level. Similar to the arrangement in FIG. 4B, IC region 500' provides a reduced number of access points for supervias because a ratio of $P_{M1}$ to $P'_{M3}$ is 2:3. In contrast to FIG. 4B, some conductive lines 545b do not overlap with conductive lines 545a along a same routing track. Thus, access points in IC region 500' are reduced due to a lack of overlapping portions of conductive lines in the different metal levels in comparison with FIG. 4B.

Figure 6:
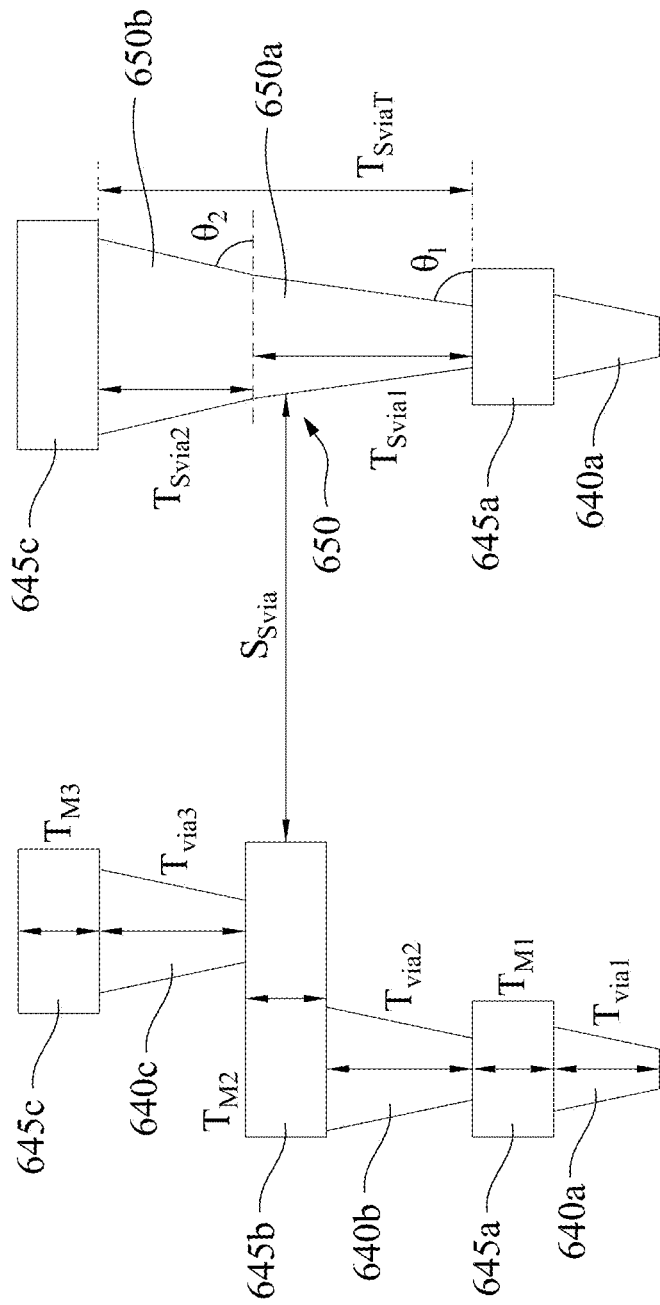
FIG. 6 is a cross-sectional view of an interconnect structure according to some embodiments.

FIG. 6 is a cross-sectional view of an interconnect structure 600 according to some embodiments. Interconnect structure 600 includes conductive vias 640a on a first metal level. Each conductive via 640a is connected to a corresponding conductive line 645a. In a first path, a conductive via 640b electrically connects a conductive line 645a and conductive line 645b; and a conductive via 640c electrically connects conductive line 645b with a conductive line 645c. In a second path, a supervia 650 directly connects a conductive line 645a to a conductive line 645c. Conductive lines 645a-645c are similar to conductive lines 145a-145e (FIG. 2). Conductive vias 640a-640c are similar to conductive vias 140a-140e (FIG. 2). Supervia 650 is similar to supervia 150a or 150b (FIG. 2).

Conductive vias 640a have a thickness Tvia1; and conductive lines 645a have a thickness TM1. Conductive via 640b has a thickness Tvia2; and conductive line 645b has a thickness TM2. Conductive via 640c has a thickness Tvia3; and conductive lines 645c have a thickness of TM3. In some embodiments, at least one of TM1, TM2 or TM3 is different from another of TM1, TM2 or TM3. In some embodiments, all of TM1, TM2 and TM3 have a same magnitude. In some embodiments, at least one of Tvia1, Tvia2 or Tvia3 is different from another of Tvia1, Tvia2 or Tvia3. In some embodiments, all of Tvia1, Tvia2 and Tvia3 have a same magnitude.

Supervia 650 includes a first section 650a contacting conductive line 645a; and a second section 650b contacting conductive line 645c. A total thickness of supervia 650 is TsviaT. The total thickness of supervia TsviaT is equal to a sum of Tvia2, TM2 and Tvia3.

An angle between a top surface of conductive line 645a and a sidewall of first section 650a is θ1. A thickness Tsvia1 of first section 650a is equal to a sum of Tvia2 and TM2.

A thickness Tsvia2 of second section 650b is equal to Tvia3. Tsvia2 is less than Tsvia1. An angle between a line parallel to the top surface of conductive line 645a and a sidewall of second section 650b is θ2. In some embodiments, θ1 is equal to θ2. In some embodiments, θ1 is greater than θ2. When θ1 is equal to θ2 the sidewall of supervia 650 has a uniform tapered shape. When θ1 is different from θ2 the sidewall of supervia 650 varies at point level with a top surface of conductive line 645b. In some embodiments, a uniform tapered shape indicates that supervia 650 is formed using a single etching and filling process. In some embodiments, a varied tapered shape indicates that supervia 650 is formed as two separate etching and filling processes.

Supervia 650 is spaced from conductive line 645b by a spacing distance Ssvia. The spacing distance Ssvia is determined based on parasitic capacitance and resistance tolerance of the IC containing interconnect structure 600 as well as manufacturing processes used to make interconnect structure 600. The spacing distance Ssvia is less than a spacing between conductive line 645b and another conductive line (not shown) on the same metal level as conductive line 645b. The reduced spacing distance Ssvia permitted by the use of supervia 650 helps to reduce the overall size of interconnect structure 600 and the corresponding IC.

Figure 7A:
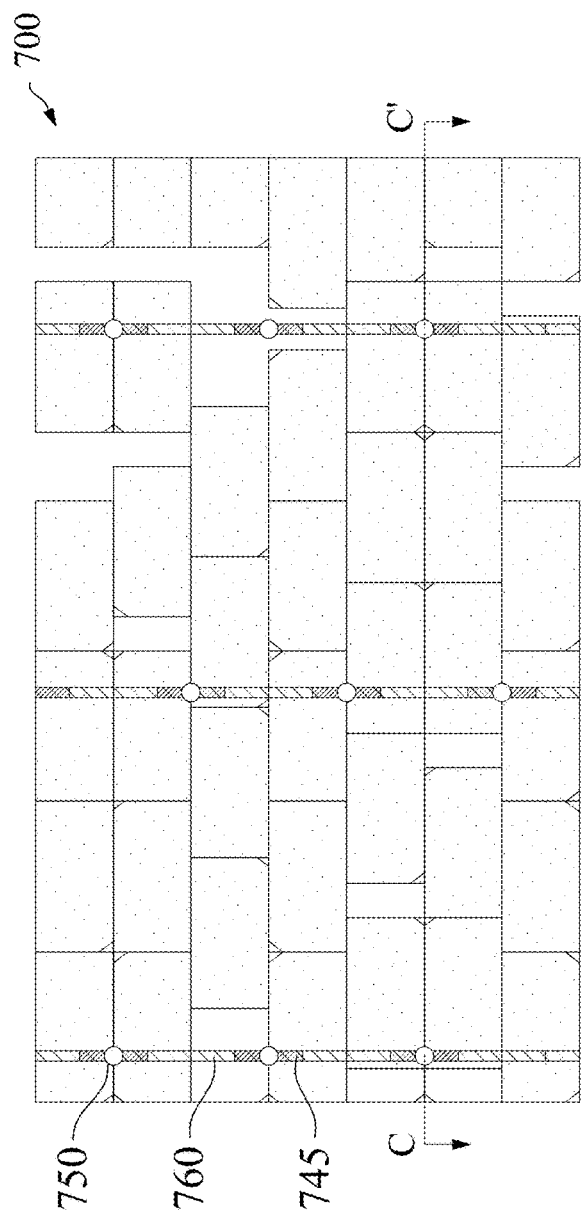
FIG. 7A is a top view of an IC region according to some embodiments.

FIG. 7A is a top view of an IC region 700 according to some embodiments. IC region 700 includes a conductive line 745 and a supervia 750 electrically connected to the conductive line 745. IC region 700 further includes power ground (PG) rails 760. PG rails 760 carry operating voltage VDD or reference voltage VSS to devices within IC region 700. Supervia 750 electrically connects a PG rail 760 to a conductive line 745.

Figure 7B:
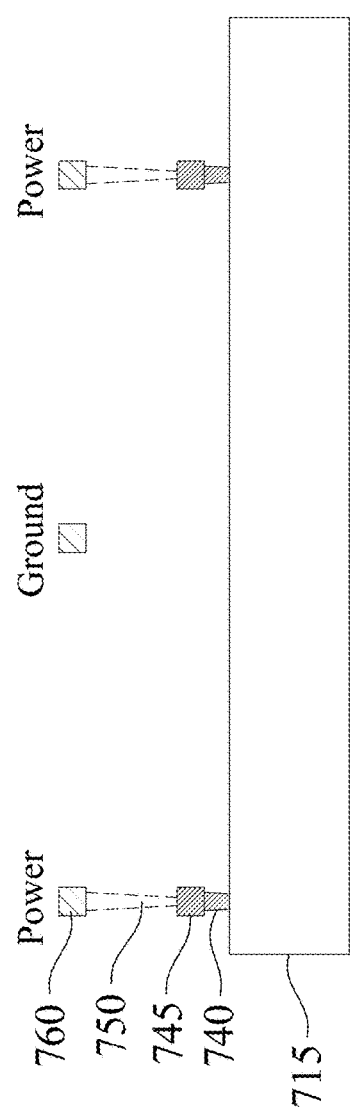
FIG. 7B is a cross-sectional view of the IC region of FIG. 7A according to some embodiments.

FIG. 7B is a cross-sectional view of the IC region 700 along line C-C' according to some embodiments. Conductive line 745 is electrically connected to a cell region 715 by conductive via 740. Conductive line 745 is similar to conductive lines 145a-145e (FIG. 2). Conductive via 740 is similar to conductive vias 140a-140e (FIG. 2). Supervia 750 is similar to supervia 150a or 150b. Cell region 715 includes active or passive devices of IC region 700.

In some approaches that do not include a supervia, PG rails are arranged in pairs. Arranging PG rails in pairs helps to reduce EM effects within the path between the PG rail and the cell region by reducing the current from each PG rail to the cell region. However, when the PG rails are arranged in pairs, the signal from the pair of PG rails is eventually consolidated in order to reach the cell region. For example, each of the PG rails in the pair is connected to a conductive line along separate paths, but then a single via connects the conductive line to the cell region. At the point where the PG rails are connected (through conductive lines and vias) to the conductive line at which the signals are consolidated, the current must change direction to be parallel to a top surface of the cell region. This change in direction increases EM effects at the corners of the conductive line. As a result, the conductive line has an increased risk of failure rendering the IC inoperable.

In contrast with approaches that include PG rails in pairs, IC region 700 provides a more direct path for current to go from PG rail 760 to cell region. This more direct path reduces EM effects because the direction of the current does not significantly change. As a result, a higher current is able to be used and a single PG rail is able to replace the pair of PG rails from other approaches. As a result, fewer routing tracks within the interconnect structure are occupied by PG rails. This increases the flexibility of routing designs for conductive lines and conductive vias in the interconnect structure. Using fewer PG rails also avoid additional design constraints for separating neighboring PG rails. As a result, cells within an IC are able to be located closer together, which reduces the overall size of the IC.

Figure 8:
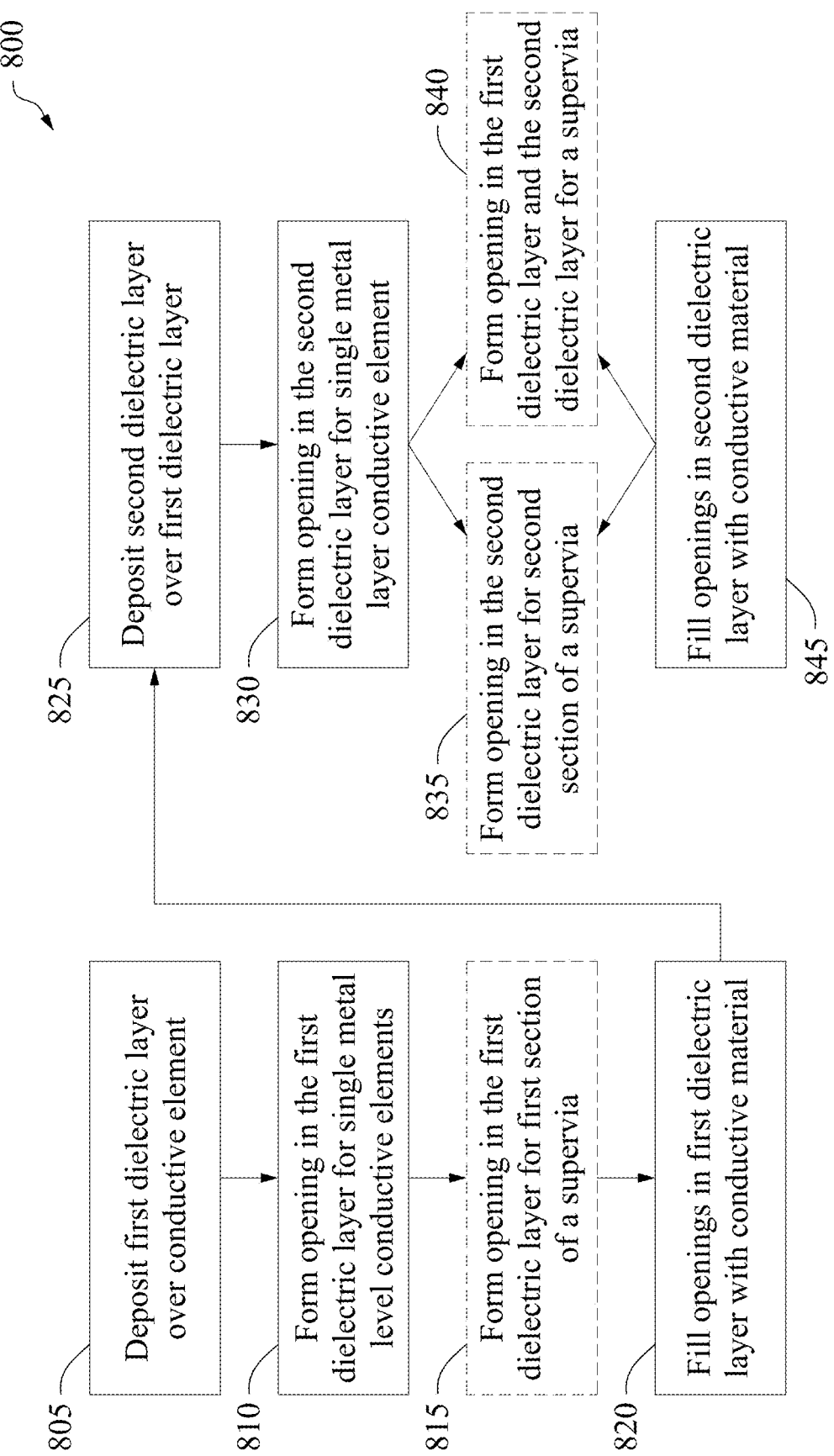
FIG. 8 is a flowchart of a method of making an IC region according to some embodiments.

FIG. 8 is a flowchart of a method 800 of making an IC region according to some embodiments. In operation 805 a first dielectric layer is deposited over a conductive element. In some embodiments, the first dielectric layer is an ILD. In some embodiments, the first dielectric layer is an IMD layer. In some embodiments, an etch stop layer is deposited prior to depositing the first dielectric layer. In some embodiments, the first dielectric layer includes a low-k dielectric material, which usually has a dielectric constant lower than 3, or extreme low-k (ELK) dielectric material, which usually has a dielectric constant lower than 2.6. In some embodiments, the first dielectric layer is deposited by CVD, PVD, HDP, SOD process, other suitable processes, and/or a combination thereof. In some embodiments, the deposition process is followed by a planarization process, such as a chemical mechanical polishing (CMP) process, an etch process, or another suitable process.

In operation 810 an opening is formed in the first dielectric layer for single metal level conductive elements. A single metal level conductive element is a conductive element that is entirely located within a single metal level of an interconnect structure. In some embodiments, the opening is formed using a patterned photoresist. In some embodiments, the opening is formed using a hard mask layer. Once the patterned photoresist or hard mask layer is formed the opening is formed using an etching process. In some embodiments, the opening is formed by a plasma assisted process, such as a reactive ion etching (RIE) process. In some embodiments, the etching process includes a wet etching process. In some embodiments, the etching process includes a dry etching process.

In optional operation 815 an opening is formed in the first dielectric layer for a first section of a supervia. In some embodiments, the opening is formed using a patterned photoresist. In some embodiments, the opening is formed using a hard mask layer. Once the patterned photoresist or hard mask layer is formed the opening is formed using an etching process. In some embodiments, the opening is formed by a plasma assisted process, such as a reactive ion etching (RIE) process. In some embodiments, the etching process includes a wet etching process. In some embodiments, the etching process includes a dry etching process. In some embodiments, operations 810 and 815 are performed simultaneously. In some embodiments, operation 810 is performed prior to operation 815. In some embodiments, operation 815 is performed prior to operation 810. In some embodiments, operation 815 is omitted and the opening for the supervia is formed at a different operation.

Figure 9A:
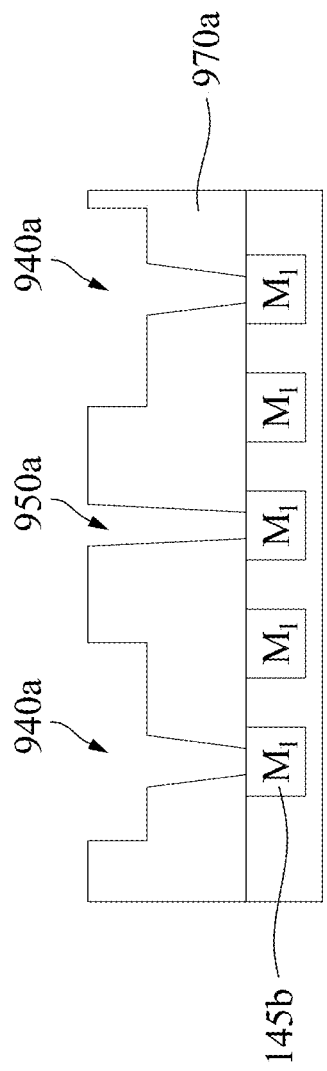
FIGS. 9A-9E are cross-sectional views of an IC region during various stages of fabrication according to some embodiments.

FIG. 9A is a cross-sectional view of an IC region following operation 815 according to some embodiments. Reference numbers in FIGS. 9A-9E that match reference numbers in FIG. 2 refer to the same elements. Portions of the IC region in FIG. 9A are omitted in comparison with FIG. 2 for the sake of simplicity. In FIG. 9A, a first dielectric layer 970a is over conductive lines 145b. Openings 940a are for single metal layer conductive elements. Openings 940a expose a portion of a corresponding conductive line 145b. Opening 950a is for a first section of a supervia. Opening 950a exposes a portion of a conductive line 145b.

Returning to FIG. 8, in operation 820 the openings in the first dielectric layer are filled with a conductive material. In some embodiments, the conductive material includes copper, tungsten, cobalt, ruthenium or another suitable conductive material. In some embodiments, the openings are filled using a plating process, PVD, sputter or another suitable process. In some embodiments, openings for single metal level conductive elements are filled separately from an opening for a section of a supervia. In some embodiments, all openings in the first dielectric layer are filled simultaneously. In some embodiments, the filling process is followed by a planarization process, such as a CMP process, an etch process, or another suitable process.

In operation 825 a second dielectric layer is deposited over the first dielectric layer. In some embodiments, an etch stop layer is deposited prior to depositing the second dielectric layer. In some embodiments, the second dielectric layer includes a low-k dielectric material, which usually has a dielectric constant lower than 3, or extreme low-k (ELK) dielectric material, which usually has a dielectric constant lower than 2.6. In some embodiments, a material of the second dielectric layer is different from a material of the first dielectric layer. In some embodiments, the material of the second dielectric layer is a same material as the first dielectric layer. In some embodiments, the first dielectric layer is deposited by CVD, PVD, HDP, SOD process, other suitable processes, and/or a combination thereof. In some embodiments, a deposition process of the second dielectric layer is different from a deposition process of the first dielectric layer. In some embodiments, the deposition process of the second dielectric layer is a same deposition process as the first dielectric layer. In some embodiments, the deposition process is followed by a planarization process, such as a CMP process, an etch process, or another suitable process.

Figure 9B:
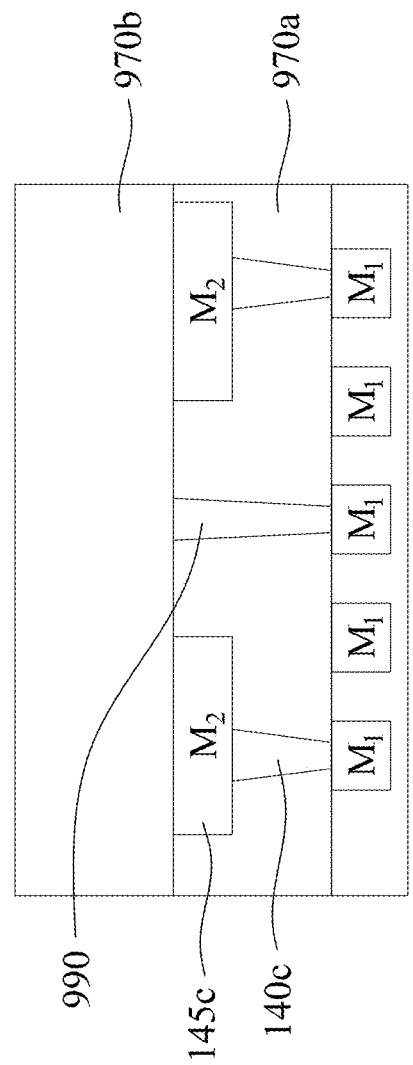

FIG. 9B is a cross-sectional view of an IC region following operation 825 according to some embodiments. In FIG. 9B, openings 940a have been filled to form conductive vias 140c and conductive lines 145c. Opening 950a has been filled to form a first section 990 of a supervia. A second dielectric layer 970b is over first dielectric layer 970a.

Returning to FIG. 8, in operation 830 an opening is formed in the second dielectric layer for single metal level conductive elements. In some embodiments, the opening is formed using a patterned photoresist. In some embodiments, the opening is formed using a hard mask layer. Once the patterned photoresist or hard mask layer is formed the opening is formed using an etching process. In some embodiments, the opening is formed by a plasma assisted process, such as a reactive ion etching (RIE) process. In some embodiments, the etching process includes a wet etching process. In some embodiments, the etching process includes a dry etching process. In some embodiments, the etching process in operation 830 is a same etching process as operation 810. In some embodiments, the etching process 830 is a different etching process from that in operation 810.

In optional operation 835 an opening is formed in the second dielectric layer for a second section of a supervia. Operation 835 is performed when operation 815 is performed. In some embodiments, the opening is formed using a patterned photoresist. In some embodiments, the opening is formed using a hard mask layer. Once the patterned photoresist or hard mask layer is formed the opening is formed using an etching process. In some embodiments, the opening is formed by a plasma assisted process, such as a reactive ion etching (RIE) process. In some embodiments, the etching process includes a wet etching process. In some embodiments, the etching process includes a dry etching process. In some embodiments, operations 830 and 835 are performed simultaneously. In some embodiments, operation 830 is performed prior to operation 835. In some embodiments, operation 835 is performed prior to operation 830. In some embodiments, operation 835 is omitted and the opening for the supervia is formed at a different operation. In some embodiments, the etching process in operation 835 is a same etching process as operation 815. In some embodiments, the etching process 835 is a different etching process from that in operation 815.

Figure 9C:
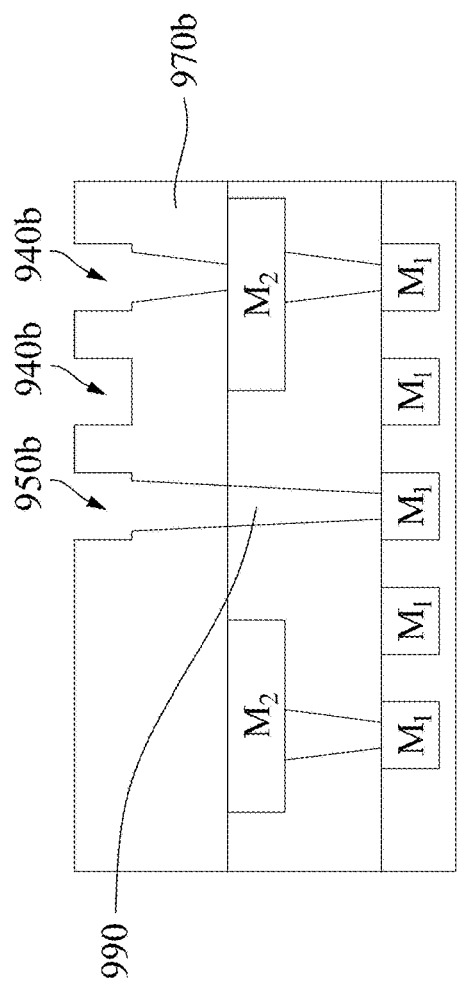

FIG. 9C is a cross-sectional view of an IC region following operation 835 according to some embodiments. Openings 940*b* are for single metal layer conductive elements. One opening 940*b* exposes a portion of a conductive line 145*c*. Another opening 940*b* does not expose a portion of a conductive line 145*c*. Opening 950*b* is for a second section of a supervia. Opening 950*b* exposes a portion of a first section 990.

Returning to FIG. 8, in optional operation 840 an opening is formed in the second dielectric layer and in the first dielectric layer for a supervia. Operation 840 is performed when optional operations 815 and 835 are not performed. In some embodiments, the opening is formed using a patterned photoresist. In some embodiments, the opening is formed using a hard mask layer. Once the patterned photoresist or hard mask layer is formed the opening is formed using an etching process. In some embodiments, the opening is formed by a plasma assisted process, such as a reactive ion etching (RIE) process. In some embodiments, the etching process includes a wet etching process. In some embodiments, the etching process includes a dry etching process. In contrast with operations 815 and 835, operation 840 formed an opening that extends through multiple dielectric layers in a same operation. In some embodiments, operation 830 and at least a portion of operation 840 are performed simultaneously. In some embodiments, operation 830 is performed prior to operation 840. In some embodiments, operation 840 is performed prior to operation 830. In some embodiments, operation 840 is omitted. In some embodiments, the etching process in operation 840 is a same etching process as operation 810 or 830. In some embodiments, the etching process 840 is a different etching process from that in operation 810 and 830.

Figure 9D:
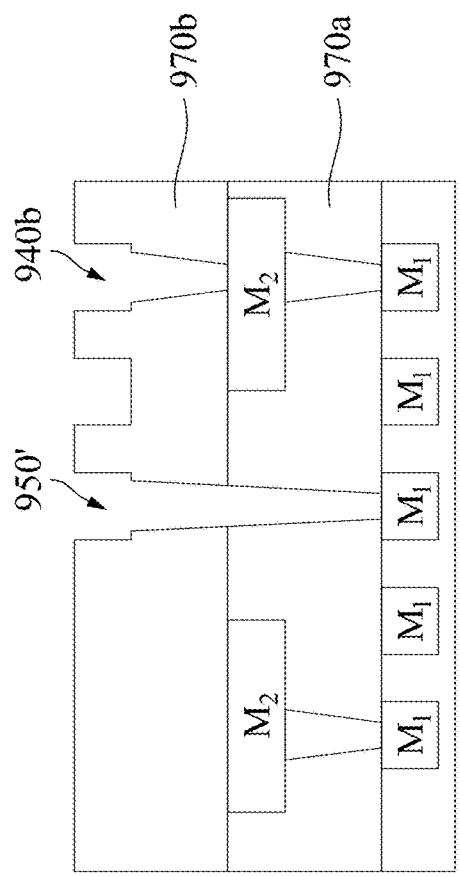

FIG. 9D is a cross-sectional view of an IC region following operation 840 according to some embodiments. In contrast with FIG. 9C, opening 950' extends through both first dielectric layer 970 and second dielectric layer 970*b*. There is no first section 990 in opening 950'. Opening 950' exposes a conductive line 145*a*.

Returning to FIG. 8, in operation 845 the openings in the second dielectric layer are filled with a conductive material. In some embodiments, the conductive material includes copper, tungsten, cobalt, ruthenium or another suitable conductive material. In some embodiments, the openings are filled using a plating process, PVD, sputter or another suitable process. In some embodiments, the conductive material in operation 845 is a same conductive material as in operation 820. In some embodiments, a conductive material in operation 845 is different from a conductive material in operation 820. In some embodiments, openings for single metal level conductive elements are filled separately from an opening for a section of a supervia. In some embodiments, all openings in the first dielectric layer are filled simultaneously. In some embodiments, the filling process in operation 845 is a same as filing process as in operation 820. In some embodiments, a filling process in operation 845 is different from a filling process in operation 820. In some embodiments, the filling process is followed by a planarization process, such as a CMP process, an etch process, or another suitable process.

Figure 9E:
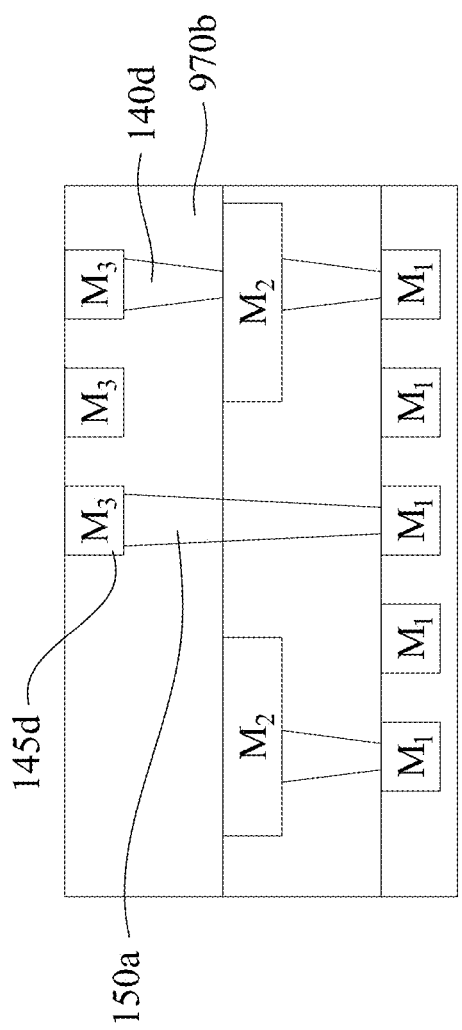

FIG. 9E is a cross-sectional view of an IC region following operation 845 according to some embodiments. In FIG. 9E, openings 940*b* have been filled to form conductive vias 140*d* and conductive lines 145*d*. Opening 950*b* or 950' has been filled to form a supervia 150*a*.

One of ordinary skill in the art would understand that the process of method 800 is repeated numerous times in order to form an interconnect structure for an IC. In some embodiments, one iteration of method 800 utilizes operations 815 and 835 while a different iteration of method 800 for a same IC utilizes operation 840. In some embodiments, every iteration of method 800 utilizes operations 815 and 835. In some embodiments, every iteration of method 800 utilizes operation 840.

In some embodiments, operations of method 800 are performed simultaneously. For example, in some embodiments, operations 810 and 815 are performed simultaneously. In some embodiments, an order of operations of method 800 is changed. For example, in some embodiments operation 820 is performed prior to operation 815. In some embodiments, additional operations are added to method 800. For example, in some embodiments, an etch stop layer is deposited; or multiple filling processes are utilized.

An aspect of this description relates to an integrated circuit. The integrated circuit includes a substrate and a first conductive line extending in a first direction parallel to a top surface of the substrate, wherein the first conductive line is a first distance from the top surface of the substrate. The integrated circuit further includes a second conductive line extending in a second direction parallel to the top surface of the substrate, wherein the second conductive line is a second distance from the top surface of the substrate, and the second distance is greater than the first distance. The integrated circuit further includes a third conductive line extending in the first direction, wherein the second conductive line is a third distance from the top surface of the substrate, and the third distance is greater than the second distance. The integrated circuit further includes a supervia directly connected to the first conductive line and the third conductive line. In some embodiments, the supervia has a uniform tapered profile. In some embodiments, the supervia has a varied tapered profile. In some embodiments, the integrated circuit further includes a fourth conductive line extending in the first direction, wherein the fourth conductive line is the first distance from the top surface of the substrate. In some embodiments, the integrated circuit further includes a via directly connected to the fourth conductive line and the second conductive line. In some embodiments, the first direction is perpendicular to the second direction. In some embodiments, the integrated circuit further includes a first dielectric layer surrounding the second conductive line; and a second dielectric layer surrounding the third conductive line. In some embodiments, the supervia extends through the first dielectric layer and the second dielectric layer. In some embodiments, the supervia includes a first section directly connected to the first conductive line, wherein a sidewall of the first section extends at a first angle with respect to the top surface of the substrate; and a second section directly connected to the third conductive line, wherein a sidewall of the second section extends at a second angle with respect to the top surface of the substrate, and the first angle is different from the second angle. In some embodiments, a thickness of the first section is greater than a thickness of the second section.

An aspect of this description relates to an integrated circuit. The integrated circuit includes a first dielectric layer. The integrated circuit further includes a first conductive line in the first dielectric layer. The integrated circuit further includes a second dielectric layer over the first dielectric layer. The integrated circuit further includes a third dielectric layer over the second dielectric layer. The integrated circuit further includes a second conductive line in the third dielectric layer. The integrated circuit further includes a supervia directly connected to the first conductive line and the second conductive line, wherein the supervia has a varied tapered profile. In some embodiments, the supervia extends partially through the third dielectric layer. In some embodiments, the integrated circuit further includes a third conductive line in the second dielectric layer. In some embodiments, the supervia includes a first section directly connected to the first conductive line, wherein the first section is in the second dielectric layer; and a second section directly connected to the second conductive line, wherein the second section is in the third dielectric layer. In some embodiments, a thickness of the first section is greater than a thickness of the second section.

An aspect of this description relates to a method including depositing a first dielectric layer over a first conductive line. The method further includes forming a first opening in the first dielectric layer. The method further includes filling the first opening with a first conductive material to define a second conductive line. The method further includes depositing a second dielectric layer over the first dielectric layer. The method further includes forming a second opening in the second dielectric layer. The method further includes filling the second opening with a second conductive material to define a third conductive line. The method further includes forming a supervia opening in the first dielectric layer and the second dielectric layer. The method further includes filling the supervia opening with a third conductive material to define a supervia, wherein the supervia directly connects to the first conductive line and the third conductive line. In some embodiments, forming the supervia opening includes forming a portion of the supervia opening simultaneously with forming the first opening. In some embodiments, forming the supervia opening includes forming a portion of the supervia opening simultaneously with forming the second opening. In some embodiments, filling the supervia opening includes filling a portion of the supervia opening simultaneously with filling the first opening. In some embodiments, filling the supervia opening includes filling a portion of the supervia opening simultaneously with filling the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a substrate;
a first conductive line extending in a first direction parallel to a top surface of the substrate, wherein the first conductive line is a first distance from the top surface of the substrate;
a second conductive line extending in a second direction parallel to the top surface of the substrate, wherein the second conductive line is a second distance from the top surface of the substrate, and the second distance is greater than the first distance;
a third conductive line extending in the first direction, wherein the third conductive line is a third distance from the top surface of the substrate, and the third distance is greater than the second distance; and
a supervia directly connected to the first conductive line and the third conductive line, wherein a first angle between a lower sidewall of a lower portion of the supervia and the top surface of the substrate is different from a second angle between an upper sidewall of an upper portion of the supervia and the top surface of the substrate.

2. The integrated circuit of claim 1, wherein the supervia is continuous from the first conductive line to the second conductive line.

3. The integrated circuit of claim 1, wherein a transition from the lower portion of the super via to the upper portion of the super via is aligned with the second conductive line in the second direction.

4. The integrated circuit of claim 1, further comprising a fourth conductive line extending in the first direction, wherein the fourth conductive line is the first distance from the top surface of the substrate.

5. The integrated circuit of claim 4, further comprising a second supervia directly connected to the fourth conductive line and the second conductive line.

6. The integrated circuit of claim 1, wherein the first direction is perpendicular to the second direction.

7. The integrated circuit of claim 1, further comprising:
a first dielectric layer surrounding the second conductive line; and
a second dielectric layer surrounding the third conductive line.

8. The integrated circuit of claim 7, wherein the supervia extends through the first dielectric layer and the second dielectric layer.

9. The integrated circuit of claim 1, wherein the supervia comprises:
a first section directly connected to the first conductive line, wherein a sidewall of the first section extends at a first angle with respect to the top surface of the substrate; and
a second section directly connected to the third conductive line, wherein a sidewall of the second section extends at a second angle with respect to the top surface of the substrate, and the first angle is different from the second angle.

10. The integrated circuit of claim 9, wherein a thickness of the first section is greater than a thickness of the second section.

11. An integrated circuit comprising:
a first dielectric layer;
a first conductive line in the first dielectric layer;
a second dielectric layer over the first dielectric layer;
a third dielectric layer over the second dielectric layer;
a second conductive line in the third dielectric layer; and
a supervia directly connected to the first conductive line and the second conductive line, wherein the supervia has a varied tapered profile.

12. The integrated circuit of claim 11, wherein the supervia extends partially through the third dielectric layer.

13. The integrated circuit of claim 11, further comprising a third conductive line in the second dielectric layer.

14. The integrated circuit of claim 11, wherein the supervia comprises:
- a first section directly connected to the first conductive line, wherein the first section is in the second dielectric layer; and
- a second section directly connected to the second conductive line, wherein the second section is in the third dielectric layer.

15. The integrated circuit of claim 14, wherein a thickness of the first section is greater than a thickness of the second section.

16. An integrated circuit comprising:
- a substrate;
- a first conductive line extending in a first direction parallel to a top surface of the substrate, wherein the first conductive line is a first distance from the top surface of the substrate;
- a second conductive line extending in a second direction parallel to the top surface of the substrate, wherein the second conductive line is a second distance from the top surface of the substrate, and the second distance is different from the first distance;
- a third conductive line extending in the first direction, wherein the third conductive line is a third distance from the top surface of the substrate, and the third distance is different than the second distance and the first distance; and
- a supervia electrically connected to the first conductive line and the third conductive line, wherein a first angle between a sidewall of the supervia below a top-most surface of the second conductive line and the top surface of the substrate is different from a second angle between the sidewall of the supervia above the top-most surface of the second conductive line and the top surface of the substrate.

17. The integrated circuit of claim 16, wherein the supervia is electrically connected to the second conductive line.

18. The integrated circuit of claim 17, wherein the supervia is electrically connected to the second conductive line through the first conductive line.

19. The integrated circuit of claim 16, wherein the supervia is electrically insulated form the second conductive line.

20. The integrated circuit of claim 16, wherein the supervia has a continuously tapered profile between the first conductive line and the third conductive line.

* * * * *